(12) United States Patent
Yong et al.

(10) Patent No.: US 7,737,638 B2
(45) Date of Patent: Jun. 15, 2010

(54) LIGHT-EMITTING DEVICE

(75) Inventors: Lig Yi Yong, Penang (MY); Siang Ling Oon, Penang (MY); Kean Loo Keh, Penang (MY); Kum Soon Wong, Wilayah Persekutuan (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 133 days.

(21) Appl. No.: 12/056,095

(22) Filed: Mar. 26, 2008

(65) Prior Publication Data

US 2009/0243465 A1    Oct. 1, 2009

(51) Int. Cl.
*H01J 1/62* (2006.01)
(52) U.S. Cl. ...................................... 313/512; 362/294
(58) Field of Classification Search ................ 313/580, 313/502–512; 362/294
See application file for complete search history.

(56) References Cited

U.S. PATENT DOCUMENTS

2005/0135105 A1* 6/2005 Teixeira et al. .............. 362/294
2008/0054804 A1* 3/2008 Kitamura et al. ............ 313/512

* cited by examiner

*Primary Examiner*—Joseph L Williams
*Assistant Examiner*—Brenitra M Lee

(57) ABSTRACT

A light-emitting device having an anode and a cathode is disclosed herein. An embodiment of the light-emitting device comprises a first lead connected to the anode of the light-emitting device and a second lead connected to the cathode of the light-emitting device. The first lead has a first bend, wherein the direction of the first bend indicates that the first lead is connected to the anode. The second lead has a second bend, wherein the direction of the second bend indicates that the second lead is connected to the cathode.

8 Claims, 2 Drawing Sheets

LIGHT-EMITTING DEVICE

BACKGROUND

Many light-emitting devices have a light-emitting diode or similar device located therein that serves as a light source. A light-emitting diode requires a forward current to pass through it in order to emit light. Therefore, when a light-emitting device is connected to a circuit or the like, the polarity must be correct; otherwise, no light will be emitted.

Many light-emitting devices have markings to indicate cathode and anode in order to connect them correctly. However, as light-emitting devices get smaller, it is difficult to see these markings, which can lead to incorrectly connected light-emitting devices.

DETAILED DESCRIPTION

Figure 1:
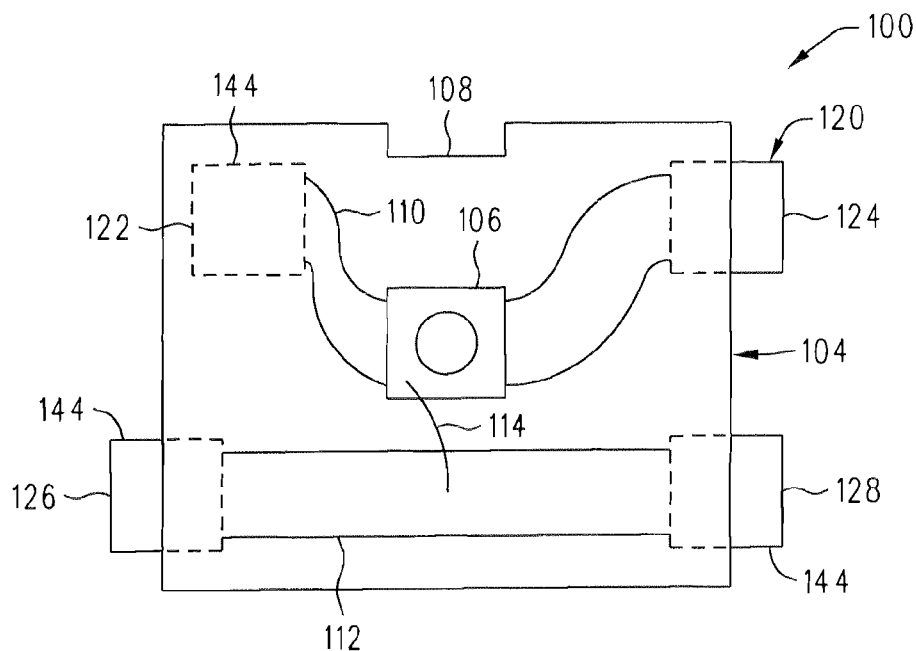
FIG. 1 is a top plan view of an embodiment of a light-emitting device.

A top plan view of a light-emitting device 100 is shown in FIG. 1. The light-emitting device 100 has a substrate 104 on which a light source 106 is mounted. The light-source may be a light-emitting diode or the like. The light source 106 has an anode terminal and a cathode terminal which require the correct voltage polarity in order for the light source 106 to emit light. The substrate 104 has a notch 108 that may provide an orientation to locate a specific lead.

The substrate 104 has electrical traces located thereon. In the embodiment of the light-emitting device 100 of FIG. 1, the substrate 104 has a first trace 110 and a second trace 112 located thereon. The first trace 110 may be connected to the anode of the light source 106 and the second trace 112 may be connected to the cathode of the light source 106. In the embodiment of FIG. 1, a lead 114 connects the cathode of the light source 106 to the second trace 112.

The light-emitting device 100 described herein has four leads 120 connected thereto. It is noted that the light-emitting device may have other numbers of leads connected thereto. The leads 120 are referred to individually as a first lead 122, a second lead 124, a third lead 126, and a fourth lead 128. In the embodiment of FIG. 1, the light-emitting device 100, the first lead 122 and the second lead 124 are connected together and connect to the anode of the light source 106. The third lead 126 and the fourth lead 128 are connected together and to the cathode of the light source 106 via the lead 114.

Figure 2:
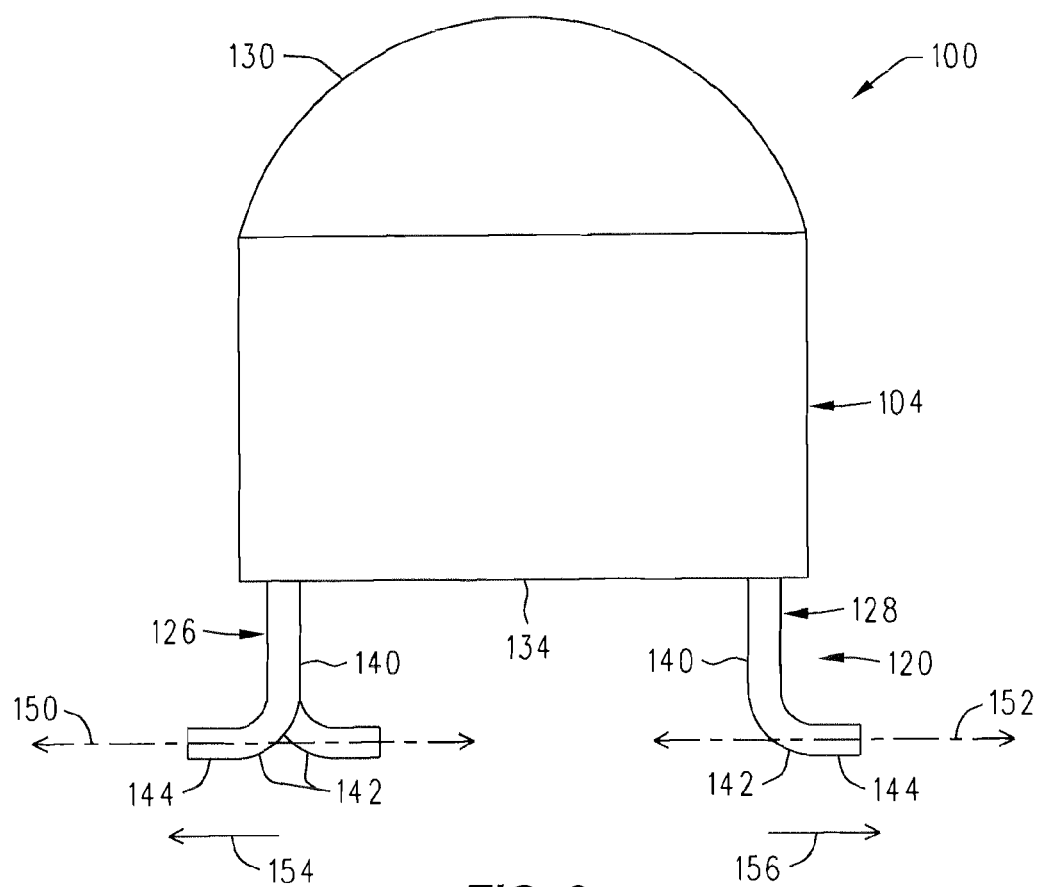
FIG. 2 is a side elevation view of the light-emitting device of FIG. 1.

A side elevation view of the light-emitting device 100 is shown in FIG. 2. A lens 130 is located on the substrate 104. The lens 130 serves to direct light emitted by the light-emitter 106, FIG. 1. Located opposite the lens 130 on the substrate 104 is a mounting portion 134 from which the leads 120 extend. The mounting portion 134 may be substantially planar and may or may not contact a circuit board or the like to which the light-emitting device 100 is eventually attached.

The leads 120 are referred to herein as having a first portion 140, a bend 142, and a second portion 144. The first portion 140 extends from the mounting portion 134. In some embodiments, the first portion 140 extends substantially perpendicular to the mounting portion 134. The bend 142 changes the direction of a leads 120 and is located between the first portion 140 and the second portion 144. As described below, the second portion 144 may extend in a direction that is substantially parallel to the mounting portion 134. The direction of the second portion 144 is sometimes referred to as the direction of the bend 142.

The second portion 144 of the third lead 126 extends along a first axis 150 and the second portion 144 of the fourth lead 128 extends along a second axis 152. The first axis 150 and the second axis 152 may be parallel to one another and parallel to the mounting portion 134. The second portions 144 of the leads 120 may extend in either a first direction 154 or a second direction 156 along the first axis 150 and the second axis 152, respectively. The direction of the second portion 144 provides an indication as to whether the lead is connected to the anode or cathode of the light emitter 106, FIG. 1. In the embodiment of the light-emitting device shown in FIG. 2, the third lead 126 is facing the first direction 154 and the fourth lead 128 is facing the second direction 156. Opposite facing leads may be indicative of the leads being connected to the cathode of the light emitter 106, FIG. 1. As described below, other configurations of the lead directions may be used.

Figure 3:
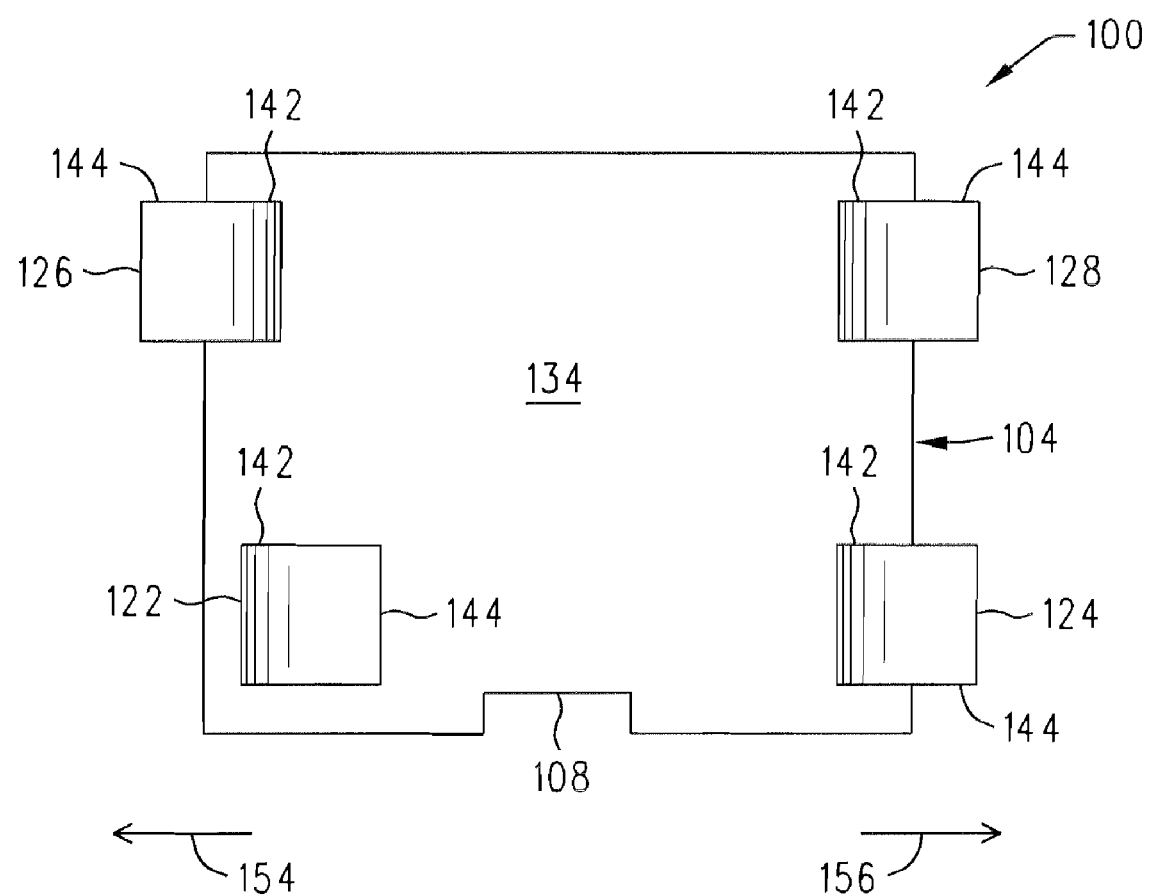
FIG. 3 is a bottom plan view of the light-emitting device of FIG. 1.

A bottom plan view of the light-emitting device 100 is shown in FIG. 3. The notch 108 may serve to identify the locations of specific leads. For example, the leads closest to the notch 108 may be connected together. As shown, the second portions 144 of the leads 120 may extend in different directions. In this embodiment, the second portions 144 of the leads 120 extend along either direction 154 or direction 156. The second portions 144 of the first lead 122 and the second lead 124 both extend in the second direction 156. When both second portions 144 extend in the same direction, they may be connected to the cathode of the light source 106, FIG. 1. The second portions 144 of the third lead 126 and the fourth lead 128 extend in opposite directions, which may be indicative of the leads 126, 128 being connected to the anode of the light source 106, FIG. 1.

Other embodiments of lead identification may be used. For example, second portions 144 that extend in the same direction may be connected to the anode and second portions that extend in opposite directions may be connected to the cathode. In another embodiment, second portions 144 that extend in one direction may be connected to the anode and second portions 144 that extend in another direction may be connected to the cathode. It is noted that the leads 120 described herein have been shown as extending in the first direction 154 or the second direction 156, wherein the first direction 154 is opposite the second direction 156. Other directions may be used. For example, the first direction 154 may not be opposite the second direction 156 and may, as an example, be perpendicular to the second direction 156.

Using the above embodiment, different lead configurations may be used. In some of these embodiments, orientation by way of the notch 108 is not required. Using the example of FIG. 3 with the above embodiment, the third lead 126 may be connected to a first terminal, i.e., an anode, because the second portion 144 of the third lead 126 extends in the first direction 154. The second portions 144 of the first lead 122, the second lead 124, and the fourth lead 128 all extend in the second direction 156, which may be indicative of them being connected to a second terminal, i.e., the cathode. In a similar embodiment, second portions 144 that bend inward may be connected to a first terminal and second portions 144 that bend outward may be connected to a second terminal.

It will be appreciated from the above and drawing FIGS. 1-3 that a light emitting-device 100 has been described. The device 100 may include a substrate 104 which has a light emitter 106 mounted inside. The light emitter has an anode and a cathode. A first lead 122 and a second lead 124 are connected to the anode. The first lead 122 has a linearly extending distal end portion 144 (also referred to above as "second end portion 144") extending in a first direction e.g. 156. The second lead 124 has a linearly extending distal end portion 144 extending in a second direction, e.g. 156 (which in some embodiments may be the same as the first direction). The directions of extension, e.g. 156, 156, of the first and second distal end portions of the anode leads 122 and 124 define an "anode leads orientation relationship," e.g., both extend in the same direction.

A third lead 126 and a fourth lead 128 are connected to the cathode of the device 100. The third lead 126 has a linearly extending distal end portion 144 extending in a third direction, e.g. 154. The fourth lead 128 has a linearly extending distal end portion extending in a fourth direction, e.g. 156. The directions of extension of the third and fourth distal end portions of the cathode leads 126, 128 define a "cathodes leads orientation relationship," e.g., the terminal ends extend in opposite directions 154, 156 and outwardly.

The "anode leads orientation relationship" is different from the "cathodes leads orientation relationship." Thus the anode leads 122, 124 may be distinguished from the cathode leads 124,126 by the different orientation relationships of their respective distal end portions.

The "cathodes leads orientation relationship" may comprise a number of different cathode leads configurations. By way of non-limiting example, both distal end portions of the cathode leads may be axially aligned and extend in the same direction; both distal end portions may be axially aligned and extend in opposite directions; the distal end portions may have one end portion extending perpendicular to a flat surface 134 of the substrate 104 and the other extending in parallel relationship to surface 134, etc. Similarly the "anode leads orientation relationship may comprise a number of different anode leads configurations, so long as the "cathodes leads orientation relationship" and the "anode leads orientation relationship" on any particular light-emitting device are different. Thus, the distal end portions of the anode leads may be axially aligned and extend in the same direction; both distal end portions may be axially aligned and extend in opposite directions; the distal end portions may have one end portion extending parallel to a flat surface 134 of the substrate 104 and the other extending in perpendicular relationship to surface 134, etc.

What is claimed is:

1. A light emitting-device comprising:
    a substrate;
    a light emitter mounted in said substrate, said light emitter having an anode and a cathode;
    a first lead and a second lead connected to said anode; said first lead having a linearly extending distal end portion positioned outside said substrate and extending in a first direction; said second lead having a linearly extending distal end portion positioned outside said substrate and extending in a second direction; said directions of extension of said first and second distal end portions defining an anode leads orientation relationship;
    a third lead and a fourth lead connected to said cathode; said third lead having a linearly extending distal end portion positioned outside said substrate and extending in a third direction; said fourth lead having a linearly extending distal end portion positioned outside said substrate and extending in a fourth direction; said directions of extension of said third and fourth distal end portions defining a cathodes leads orientation relationship;
    wherein said anode leads orientation relationship is different from said cathodes leads orientation relationship.

2. The light emitting-device of claim 1, wherein either said anode leads orientation relationship or said cathode leads orientation relationship is that the distal end portions extend in the same direction.

3. The light emitting-device of claim 1, wherein either said anode leads orientation relationship or said cathode leads orientation relationship is that the distal end portions extend in different directions.

4. The light emitting-device of claim 1, wherein either said anode leads orientation relationship or said cathode leads orientation relationship is that the distal end portions extend in opposite directions.

5. The light emitting-device of claim 1, wherein said substrate has a first flat surface and wherein either said anode leads orientation relationship or said cathode leads orientation relationship is that at least one of the distal end portions extends in a direction perpendicular to said first flat surface.

6. The light emitting-device of claim 1 wherein said substrate has a first flat surface and wherein either said anode leads orientation relationship or said cathode leads orientation relationship is that at least one of the distal end portions extends in a direction parallel to said first flat surface.

7. The light emitting-device of claim 1, wherein said substrate has a first flat surface and wherein either said anode leads orientation relationship or said cathode leads orientation relationship is that one of the distal end portions extends in a direction perpendicular to said first flat surface and the other distal end portion extends parallel to said first flat surface.

8. The light emitting-device of claim 1, wherein said substrate comprises a notch wherein either said first and second leads or said third and fourth leads are located closest to the notch.

* * * * *